US012693353B2

(12) United States Patent　　　(10) Patent No.:　US 12,693,353 B2
Liu　　　　　　　　　　　　　　　(45) Date of Patent:　　Jul. 28, 2026

(54) SAR VALUE ACQUISITION METHOD IN MRI, SAR VALUE ACQUISITION SYSTEM, ELECTRONIC APPARATUS, AND STORAGE MEDIUM

(71) Applicant: UNITED IMAGING RESEARCH INSTITUTE OF INNOVATIVE MEDICAL EQUIPMENT., Shenzhen (CN)

(72) Inventor: Jin Liu, Shenzhen (CN)

(73) Assignee: UNITED IMAGING RESEARCH INSTITUTE OF INNOVATIVE MEDICAL EQUIPMENT., Shenzhen (CN)

( * ) Notice: Subject to any disclaimer, the term of this patent is extended or adjusted under 35 U.S.C. 154(b) by 268 days.

(21) Appl. No.: 18/534,776

(22) Filed: Dec. 11, 2023

(65) Prior Publication Data

US 2024/0192293 A1　　Jun. 13, 2024

(30) Foreign Application Priority Data

Dec. 9, 2022　(CN) .......................... 202211583463.6

(51) Int. Cl.
G01R 33/28　　　　(2006.01)
(52) U.S. Cl.
CPC ................................. G01R 33/288 (2013.01)
(58) Field of Classification Search
None
See application file for complete search history.

(56) References Cited

U.S. PATENT DOCUMENTS 12,295,712 B2 *　5/2025　Kimmlingen .......... G16H 40/63
2007/0241753 A1　10/2007　Sodickson et al.
(Continued)

FOREIGN PATENT DOCUMENTS

CN　　102651043 A　　8/2012
CN　　109908474 A　　6/2019
(Continued)

OTHER PUBLICATIONS

Katscher, et al., Determination of Electric Conductivity and Local SAR via B1 Mapping, IEEE Transactions on Medical Imaging, vol. 28, No. 9, Sep. 2009. (Year: 2009).*
(Continued)

*Primary Examiner* — Rodney E Fuller

(57)　　　　　ABSTRACT

A specific absorption rate (SAR) value acquisition method in magnetic resonance imaging includes acquiring a mapping relation between distribution data of radio frequency (RF) coil transmission field of each channel of an RF transmitter coil and distribution data of RF electric field of each channel of the RF transmitter coil, obtaining a mapping relation set, acquiring first distribution data of RF coil transmission field of each channel during an examination of a test person, determining first distribution data of RF electric field of each channel during the examination of the test person according to the first distribution data of RF coil transmission field of each channel and the mapping relation set, adjusting a weight of each channel according to the first distribution data of RF electric field of each channel acquired during the examination of the test person, and determining a distribution of SAR values of the test person.

20 Claims, 7 Drawing Sheets

(56)  References Cited

U.S. PATENT DOCUMENTS

| | | | | |
|---|---|---|---|---|
| 2019/0086499 | A1* | 3/2019 | Ohishi | G01R 33/385 |
| 2020/0142057 | A1* | 5/2020 | Pendse | G01R 33/5608 |
| 2021/0109178 | A1* | 4/2021 | Gumbrecht | G01R 33/3852 |

FOREIGN PATENT DOCUMENTS

| | | | | |
|---|---|---|---|---|
| CN | 113017598 A | 6/2021 | | |
| WO | WO-2017219765 A1 * | 12/2017 | | G01R 33/54 |

OTHER PUBLICATIONS

Han Jijun, "Research on Key Technologies in Magnetic Resonance Electrical Properties Tomography for Human Tissues", China National Knowledge Infrastructure, May 16, 2021 (137 pages).
Liu Boxue, "The Research on Distribution Characteristics of Electromagnetic Field", China National Knowledge Infrastructure, Mar. 16, 2019, (85 pages).
CN2022115834636 Office Action of Nov. 12, 2025.

* cited by examiner

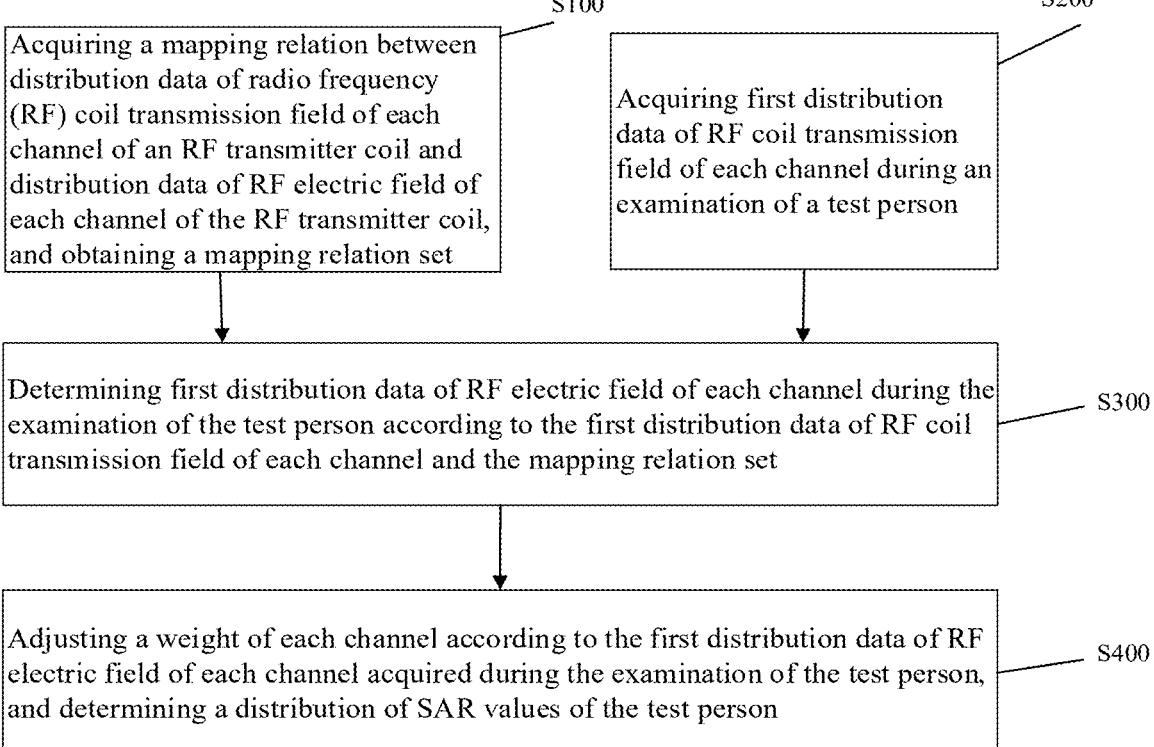

S100

Acquiring a mapping relation between distribution data of radio frequency (RF) coil transmission field of each channel of an RF transmitter coil and distribution data of RF electric field of each channel of the RF transmitter coil, and obtaining a mapping relation set

S200

Acquiring first distribution data of RF coil transmission field of each channel during an examination of a test person Determining first distribution data of RF electric field of each channel during the examination of the test person according to the first distribution data of RF coil transmission field of each channel and the mapping relation set

S300

Adjusting a weight of each channel according to the first distribution data of RF electric field of each channel acquired during the examination of the test person, and determining a distribution of SAR values of the test person

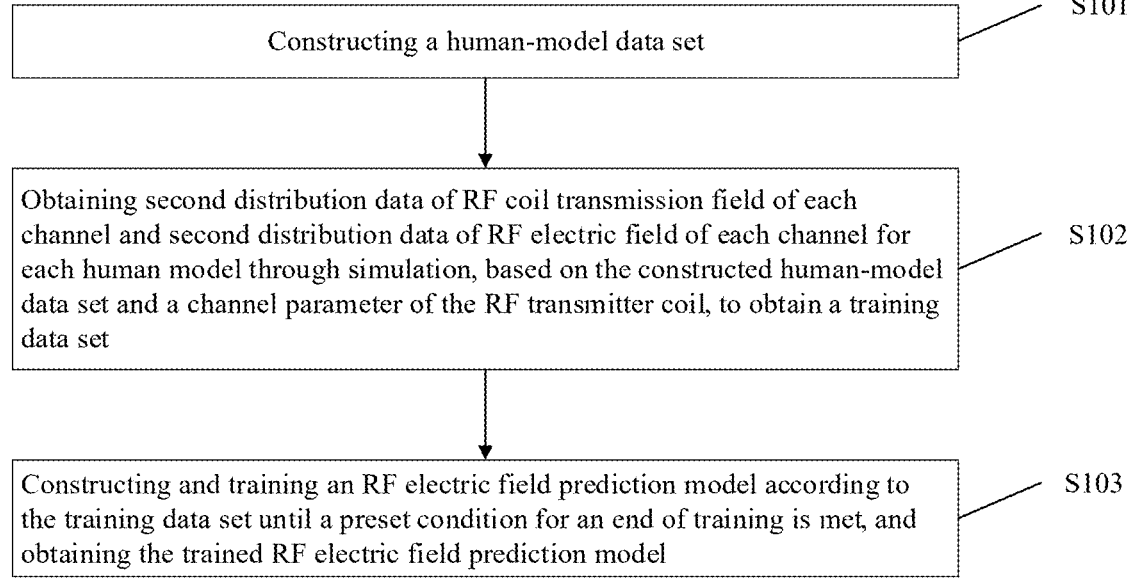

Constructing a human-model data set — S101

Obtaining second distribution data of RF coil transmission field of each channel and second distribution data of RF electric field of each channel for each human model through simulation, based on the constructed human-model data set and a channel parameter of the RF transmitter coil, to obtain a training data set — S102

Constructing and training an RF electric field prediction model according to the training data set until a preset condition for an end of training is met, and obtaining the trained RF electric field prediction model — S103

FIG. 2

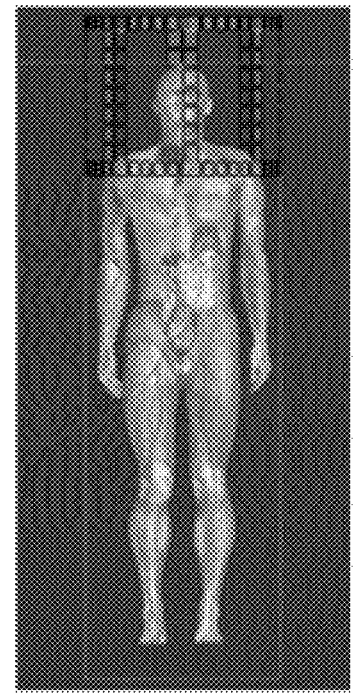
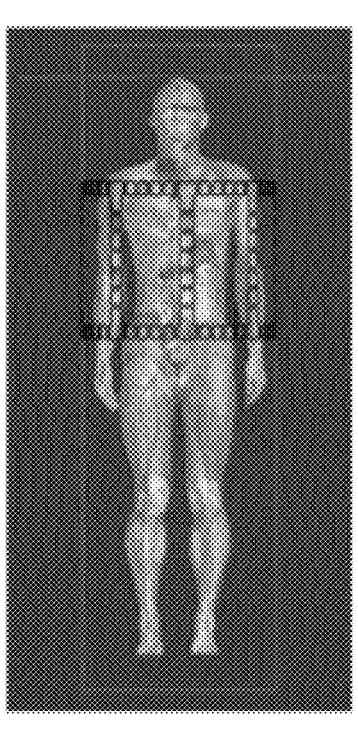
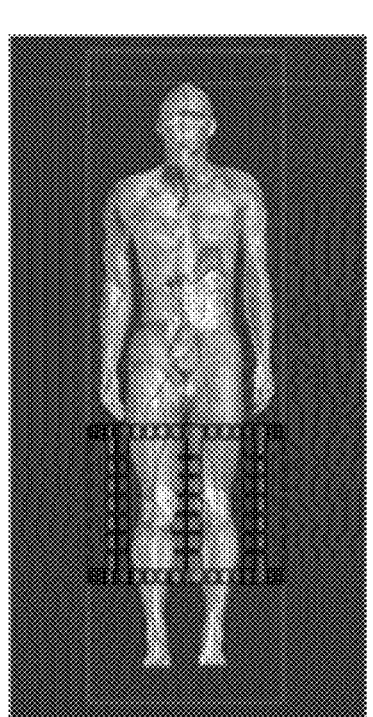
FIG. 3

1

SAR VALUE ACQUISITION METHOD IN MRI, SAR VALUE ACQUISITION SYSTEM, ELECTRONIC APPARATUS, AND STORAGE MEDIUM

CROSS-REFERENCE TO RELATED APPLICATION

The present application claims the priority of Chinese patent application No. 202211583463.6, filed on Dec. 9, 2022, and entitled "SAR VALUE ACQUISITION METHOD IN MRI, SAR VALUE ACQUISITION SYSTEM, ELECTRONIC APPARATUS, AND STORAGE MEDIUM", which is incorporated herein by reference in its entirety.

TECHNICAL FIELD

The present disclosure relates to the technical field of magnetic resonance imaging (MRI), and in particular, to a specific absorption rate (SAR) value acquisition method in MRI, an SAR value acquisition system, an electronic apparatus, and a storage medium.

BACKGROUND

MRI is an imaging technology that uses magnetic resonance phenomena. Compared with low-field magnetic resonance, ultra-high-field magnetic resonance may provide a higher signal-to-noise ratio, thereby improving imaging quality. However, along with the increase of the field strength of the main magnetic field, the wavelength of the electromagnetic wave inside the human body becomes shorter as the frequency increases, and a standing wave effect occurs at wavelengths close to the dimensions of the human body, thus causing two problems. The first problem is that the collected image signals are uneven, and the second problem is that the radio frequency (RF) energy deposition in human tissues is also increased accordingly, thus causing insecurity for the test person. In recent years, in order to solve the problem of uneven image signals, a large number of methods using multi-channel parallel transmission for optimizing the RF field are provided in the art. However, with regard to the second problem, the measurement of SAR values in a local tissue of the human body is still one of the problems that need to be solved urgently, and relevant solutions have not been disclosed in technical data.

It should be noted that the information disclosed in this BACKGROUND of this specification is only intended to make the general background technology of the present invention be understood better, but should not be deemed to admit, or is not intended to imply in any forms, that the information constitutes the prior art known to those skilled in the art.

SUMMARY

The present disclosure provides an SAR value acquisition method in MRI, an SAR value acquisition system, an electronic apparatus, and a storage medium.

The SAR value acquisition method in MRI includes the following steps.

A mapping relation between distribution data of RF coil transmission field of each channel of an RF transmitter coil and distribution data of RF electric field of each channel of the RF transmitter coil is acquired, and a mapping relation set is obtained.

First distribution data of RF coil transmission field of each channel are acquired during an examination of a test person.

First distribution data of RF electric field of each channel are determined during the examination of the test person according to the first distribution data of RF coil transmission field of each channel and the mapping relation set.

A weight of each channel is adjusted according to the first distribution data of RF electric field of each channel acquired during the examination of the test person, and a distribution of SAR values of the test person is determined.

In some embodiments, the mapping relation between the distribution data of the RF coil transmission field of each channel of the RF transmitter coil and the distribution data of RF electric field of each channel of the RF transmitter coil is a trained RF electric field prediction model.

In some embodiments, the acquiring the mapping relation between the distribution data of RF coil transmission field of each channel of the RF transmitter coil and the distribution data of RF electric field of each channel of the RF transmitter coil, and the obtaining the mapping relation set include the following steps.

A trained RF electric field prediction model is acquired.

The distribution data of RF coil transmission field of each channel of the RF transmitter coil, are inputted into the RF electric field prediction model to predict and obtain the distribution data of RF electric field of each channel.

The mapping relation set is obtained based on the distribution data of RF coil transmission field of each channel and the distribution data of RF electric field of each channel.

In some embodiments, the acquiring the trained RF electric field prediction model includes the following steps.

A human-model data set is constructed.

Second distribution data of RF coil transmission field of each channel and second distribution data of RF electric field of each channel for each human model are obtained through simulation based on the constructed human-model data set and a channel parameter of the RF transmitter coil to obtain a training data set.

An RF electric field prediction model is constructed and trained according to the training data set until a preset condition for an end of training is met to obtain the trained RF electric field prediction model.

In some embodiments, each human model in the human-model data set includes electromagnetic parameters of human tissue.

The construction of human-model data set includes the following steps.

Electromagnetic parameters of human tissue of at least two typical human models selected from a human-model library are obtained.

The electromagnetic parameters of human tissue of the at least two typical human models are augmented, and a new human model is constructed based on the augmented electromagnetic parameters, and the new human model is added in the typical human models.

Steps of augmenting the electromagnetic parameters of human tissue of the at least two typical human models, constructing the new human model based on the augmented electromagnetic parameters, and adding the new human model in the typical human models are executed iteratively, until a preset target for constructing human models is satisfied.

The human-model data set is obtained based on the typical human models.

In some embodiments, the obtaining the second distribution data of RF coil transmission field of each channel and the second distribution data of RF electric field of each channel for each human model through simulation, based on the constructed human-model data set and the channel parameter of the RF transmitter coil, to obtain the training data set, includes the following steps.

The number of scan segments and a scan part corresponding to each of the scan segments of each human model are determined according to dimensions of the RF transmitter coil.

Segmented scans are performed on each human model according to the channel parameter of the RF transmitter coil, the number of the scan segments of each human model and the scan part corresponding to each of the scan segments, to obtain third distribution data of RF coil transmission field and third distribution data of RF electric field of the scan part corresponding to each scan segment of each human model.

The second distribution data of RF coil transmission field of each channel and the second distribution data of RF electric field of each channel for all tissues of each human model are obtained based on the third distribution data of RF coil transmission field and the third distribution data of RF electric field of the scan part corresponding to each scan segment of each human model.

In some embodiments, the RF electric field prediction model includes a generative adversarial networks model. The constructing and training the RF electric field prediction model includes: determining a loss function for training the RF electric field prediction model, according to a standard loss function of the generative adversarial networks model and priori knowledge of electromagnetic field.

In some embodiments, the adjusting the weight of each channel according to the first distribution data of RF electric field of each channel acquired during the examination of the test person, and determining the distribution of SAR values of the test person, include: adjusting at least one of an amplitude or a phase of an impulse of RF transmission of a channel corresponding to the first distribution data of RF electric field of each channel, according to the first distribution data of RF electric field of each channel acquired during the examination of the test person, and determining the distribution of the SAR values of the test person.

In some embodiments, a field strength of the RF transmitter coil is 3 T or 5 T, and the RF transmitter coil has 8 channels.

In some embodiments, one of the electromagnetic parameters of human tissue includes at least one of a dielectric constant, an electrical conductivity, or a magnetic permeability of the human tissue.

In some embodiments, the preset target for constructing the human models is a preset number of human models.

In some embodiments, one of the channel parameters of the RF transmitter coil includes at least one of the number of channels, a duration of an RF transmission of each channel, a flip angle of the RF transmission, an amplitude of an impulse of the RF transmission, or a phase of the impulse of the RF transmission.

In some embodiments, the number of samples in the training data set is a product of the number of human models and the number of channels of the RF transmitter coil, and each of the samples is a data pair including the second distribution data of RF coil transmission field of a corresponding channel and the second distribution data of RF electric field of the corresponding channel.

The present disclosure also provides an MRI system, including: an imaging device and an SAR value acquisition device. The imaging device includes an RF transmitter coil, and the SAR value acquisition device includes a prediction unit for RF electric field distribution and an SAR value acquisition unit.

The prediction unit for RF electric field distribution is configured to: acquire a mapping relation between distribution data of RF coil transmission field of each channel of the RF transmitter coil and distribution data of RF electric field of each channel of the RF transmitter coil, and obtain a mapping relation set.

The SAR value acquisition unit is configured to: acquire first distribution data of RF coil transmission field of each channel during an examination of a test person; determine first distribution data of RF electric field of each channel during the examination of the test person according to the first distribution data of RF coil transmission field of each channel and the mapping relation set; and adjust a weight of each channel according to the first distribution data of RF electric field of each channel acquired during the examination of the test person, and determine a distribution of SAR values of the test person.

In some embodiments, the RF transmitter coil includes a multi-channel array transmitter coil, a full volume transmitter coil, or a partial volume transmitter coil.

The present disclosure also provides an electronic apparatus. The electronic apparatus includes a processor and a storage medium. A computer program is stored on the storage medium. The processor, when executing the computer program, performs steps of any one of the SAR value acquisition methods in MRI above.

The present disclosure further provides a non-transitory computer-readable storage medium. A computer program is stored on the storage medium. The computer program, when being executed by a processor, causes the processor to perform steps of any one of the SAR value acquisition method in MRI above.

Compared with the prior art, the SAR value acquisition method in MRI, the SAR value acquisition system, the electronic apparatus, and the non-transitory computer-readable storage medium provided by the present disclosure have the following advantages.

In the SAR value acquisition method in MRI provided by this disclosure, firstly, the mapping relation between the distribution data of RF coil transmission field of each channel of the RF transmitter coil and the distribution data of RF electric field of each channel of the RF transmitter coil is acquired, and the mapping relation set is obtained. Then the first distribution data of RF coil transmission field of each channel are acquired during the examination of the test person. The first distribution data of RF electric field of each channel are determined during the examination of the test person according to the first distribution data of RF coil transmission field of each channel and the mapping relation set. The weight of each channel is adjusted according to the first distribution data of RF electric field of each channel acquired during the examination of the test person, and the distribution of SAR values of the test person is determined. In such an configuration, in the SAR value acquisition method in MRI provided by this disclosure, firstly, the mapping relation between the distribution data of RF coil transmission field (B1+) of each channel and the distribution data of RF electric field (E) of each channel is acquired to obtain the mapping relation set, which lays the solid foundation for subsequently obtaining the real-time first distribution data of RF electric field of each channel when the test person is undergoing a magnetic resonance examination based on the acquired first distribution data of RF coil transmission field of each channel. Furthermore, the first distribution data of RF electric field obtained by this disclosure are accurate to each channel of the RF transmitter coil, so that the weight of the channel may be adjusted in real time according to the first distribution data of RF electric field, for example, according to a superposition principle of the RF electric field and the weight of each channel, the amplitude and the phase of the RF transmission impulse of each channel are adjusted for the purpose of obtaining the optimal SAR values, thereby achieving the optimal distribution of the SAR values namely obtaining the distribution of SAR values with high accuracy, and ensuring the safety of the test person.

As the SAR value acquisition system in MRI, the electronic apparatus, and the non-transitory computer-readable storage medium provided by the present disclosure have the same inventive concepts as the SAR value acquisition method in MRI above, they have the same advantages as the SAR value acquisition method in MRI above, which will not be described repeatedly.

BRIEF DESCRIPTION OF THE DRAWINGS

FIG. 1 is a schematic flow chart of an SAR value acquisition method in MRI according to an embodiment of the present disclosure.

FIG. 2 is a schematic flow chart of obtaining an RF electric field prediction model according to an embodiment of the present disclosure.

FIG. 3 shows images illustrating scan segments according to an embodiment of the present disclosure.

Figure 4:
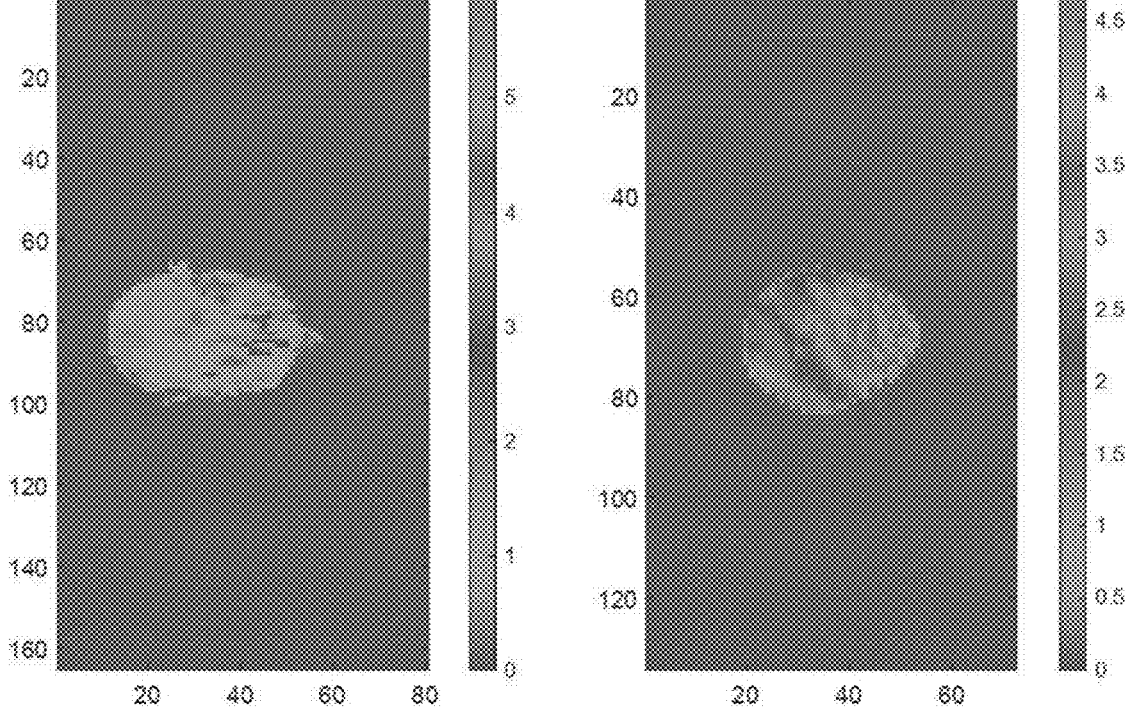
FIG. 4 shows images of E field distribution of two test persons, which are obtained by applying the SAR value acquisition method according to an embodiment of the present disclosure.

Where, reference numbers are as follows:

SAR value acquisition device—100, prediction unit for RF electric field distribution—110, SAR value acquisition unit—120, imaging device—200, RF transmitter coil—210;

processor—301, storage medium—302, communication interface—302, communication bus—304.

DETAILED DESCRIPTION OF THE EMBODIMENTS

An SAR value acquisition method in MRI, an SAR value acquisition system, an electronic apparatus, and a storage medium proposed in the present disclosure will be further described in detail hereinafter with reference to the accompanying drawings. The advantages and features of the present invention will become clearer from the following description. It should be noted that the drawings are shown in a very simplified form and in an imprecise proportion, and are only intended to assist in explaining the embodiments of the present disclosure conveniently and clearly. In order to make the objectives, features and advantages of the present disclosure to be better understood, references may be made to the accompanying drawings. It should be noted that the structures, proportions, sizes, etc., which are shown in the drawings attached to this specification, are only intended to illustrate what is disclosed in the specification, thereby enabling those skilled in the art to understand and read, but are not intended to limit the embodiments of the present disclosure. Any structural modifications, changes in proportions, or adjustments in size, as long as they may achieve the identical or similar effects as the present disclosure may achieve, may still fall within the scope of the technical contents of the present disclosure. The specific design features disclosed in the disclosure and including, for example, specific dimensions, orientations, locations and shapes, will be determined in part by a particular intended application and use environment. In addition, in the embodiments described hereinafter, the same reference number may be commonly used in different drawings to represent the same composite part or composite parts having the same function, thus omitting repeated description thereof. In this specification, similar numbers and letters are used to refer to similar composite parts, therefore, once a composite part is defined in one figure, it needs not to be further described in subsequent figures. Additionally, if a method described in the text includes a series of steps, the order of these steps presented in the text is not necessarily the only order in which these steps may be performed, and some of the steps may be omitted and/or other steps not described in the text may be added to the method.

It should be noted that in the text, relational terms, such as "first" and "second" are only used to distinguish one entity or operation from another, and do not necessarily require or imply that there should be any such an actual relationship or sequence between these entities or operations. Furthermore, the terms "comprise", "include", or other variations thereof, are intended to cover a non-exclusive inclusion, so that a process, a method, an article, or an apparatus, which includes a series of elements, includes not only these elements, but also other elements not expressly listed, or includes elements inherent to the process, method, article or apparatus. Without further limitations, an element defined by a statement "comprises a . . . " does not exclude the presence of additional identical elements in a process, a method, an article, or an apparatus, which includes the defined element. The singular forms "a", "an", and "the" each include plural objects, the term "or" is generally used to include "and/or", and the term "several" is generally used to include "at least one". The term "at least two" usually has the meaning of "two or more". In addition, the terms "first", "second", and "third" are only used for descriptive purposes, but should not be construed as indicating or implying the relative importance, or implying the number of the indicated technical features.

In order to facilitate understanding and explanation, before specifically introducing an SAR value acquisition method in MRI, an SAR value acquisition system, an electronic apparatus, and a storage medium provided by the present invention, the necessity of measuring SAR values timely and accurately is briefly explained as follows. When a test person is undergoing a magnetic resonance examination, human tissues interact with the RF electromagnetic field generated by the RF transmitter coil. The energy carried by the RF electromagnetic field is absorbed by the hydrogen protons in the human body, part of the energy is emitted in the form of RF signals, which are received by a receiver coil to generate signals, and the remaining energy is absorbed by the human tissues. The energy deposited in the human tissues is emitted in a form of heat energy. If the energy deposited in the human tissues cannot be emitted in time through the metabolism of the test person, it will cause an increase in the temperatures of the tissues and organs of the test person, and even thermal damage. Therefore, a real-time and accurate calculation of the SAR of the RF energy is of great significance to ensure the safety of test persons and to make use of MR to the utmost for serving in clinical diagnosis and treatment.

In the related technology, a method of obtaining a distribution of local specific absorption rate (Local-SAR) of RF energy in the human body has not achieved the effects of being applicable to any human body and acquiring the SAR values in real time yet. Typically, a whole-body specific absorption rate (whole-body SAR) may be extrapolated by monitoring the power recorded by a directional coupler in the MRI system. However, it is difficult to obtain the Local-SAR directly by using actual measurement methods. The most common method is a simulation calculation by using simulation software, such as CST, or Sim4Life, etc. However, there are many problems in analog simulation. Firstly, it is difficult to construct a human model required for simulation. Secondly, simulation takes a long time and cannot meet the requirements of acquiring SAR values in real time.

The objective of the present invention is to provide an SAR value acquisition method in MRI, an SAR value acquisition system, an electronic apparatus, and a storage medium to solve the problems in the related technology that it is difficult to construct a human model for an ultra-high field of a magnetic resonance system, and that calculating SAR values takes a long time, and that the calculated values have a low accuracy. The present invention can determine the distribution of SAR values of the test person in real time, thereby satisfying the real-time requirements well, and the determined distribution of SAR values has a high accuracy, thereby improving the imaging quality of MRI and ensuring the safety of the test person.

It should be noted that the SAR value acquisition method in MRI provided by the present disclosure may be applied to the MRI system and/or the electronic apparatus of the embodiment of the present disclosure. The electronic apparatus may be a personal computer, a mobile terminal, etc., and the mobile terminal may be a mobile phone, a tablet, and other hardware devices with various operating systems.

An embodiment of the present disclosure provides an SAR value acquisition method in MRI. Referring to FIG. 1, FIG. 1 is a schematic flow chart of an SAR value acquisition method in MRI according to an embodiment of the present disclosure. As shown in FIG. 1, the SAR value acquisition method in MRI provided by the embodiment of the present disclosure includes steps S100 to S400.

In step S100, a mapping relation between distribution data of RF coil transmission field of each channel and distribution data of RF electric field of each channel of an RF transmitter coil is acquired, and a mapping relation set is obtained.

In step S200, first distribution data of RF coil transmission field of each channel are acquired during an examination of a test person.

In step S300, first distribution data of RF electric field of each channel are determined during the examination of the test person according to the first distribution data of RF coil transmission field of each channel and the mapping relation set.

In step S400, a weight of each channel corresponding to the first distribution data of RF electric field of each channel is adjusted according to the first distribution data of RF electric field of each channel acquired during the examination of the test person, and a distribution of SAR values of the test person is determined.

In the SAR value acquisition method in MRI provided by this embodiment, the mapping relation between the distribution data of RF coil transmission field (B1+) of each channel and the distribution data of RF electric field (E) of each channel is pre-acquired, which laid a solid foundation for obtaining the first distribution data of RF electric field in real time during a subsequent magnetic resonance examination of the test person based on the acquired first distribution data of RF electric field. Furthermore, the first distribution data of RF electric field obtained in this embodiment are accurate to each channel of the RF transmitter coil, so that the weight of each channel corresponding to the first distribution data of RF electric field of each channel may be adjusted in real time according to the first distribution data of RF electric field of each channel, for example, for the purpose of obtaining the optimal SAR value, an amplitude and a phase of the impulse of each channel are adjusted according to a superposition principle of the RF electric field and the weight of each channel, thereby achieving the optimal distribution of the SAR values, namely obtaining the distribution of the SAR values with a high accuracy, and ensuring the safety of the test person.

In particular, it should be understood by those skilled in the art that, as shown in FIG. 1, the order of step S100 and step S200 is not limited in this disclosure. Step S100 may be performed before or after step S200, and when computing resources permit, step S100 and step S200 may even be executed in parallel. In an embodiment, the obtaining the mapping relation set in step S100 is performed before step S200. Step S200, step S300 and step S400 are steps performed in real time for each channel of the RF transmitter coil when the test person is undergoing the magnetic resonance examination. The SAR value acquisition method in MRI provided by the present invention can not only determine the distribution of SAR values of the test person in real time, which satisfies the real-time requirements well, but also determine the distribution of SAR values with high accuracy, which can improve the uniformity of the image signal, thereby improving the imaging quality of MRI and ensuring the safety of the test person.

In one of exemplary embodiments, step S100 of acquiring the mapping relation between the distribution data of RF coil transmission field of each channel and the distribution data of RF electric field of each channel of the RF transmitter coil, and obtaining the mapping relation set, includes steps S110 to S130.

In step S110, a trained RF electric field prediction model is acquired.

In step S120, the distribution data of RF coil transmission field of each channel of the RF transmitter coil, are inputted into the trained RF electric field prediction model to predict and obtain the distribution data of RF electric field of each channel.

In step S130, the mapping relation set is obtained based on the distribution data of RF coil transmission field of each channel and the distribution data of RF electric field of each channel.

In the SAR value acquisition method in MRI provided by this embodiment, firstly, the RF electric field prediction model is trained in advance. Then for each channel of the RF transmitter coil, the distribution data of RF coil transmission field of each channel are inputted into the RF electric field prediction model to obtain the predicted distribution data of RF electric field of each channel. Finally, the mapping relation set is obtained based on the distribution data of RF coil transmission field of each channel and the predicted distribution data of RF electric field of each channel. The RF electric field prediction model is trained in advance, and the first distribution data of RF coil transmission field are obtained in real time during the examination of the test person, thereby laying a foundation for obtaining the first distribution data of RF electric field of each channel during the examination of the test person, and further significantly improving the efficiency of determining the distribution of SAR values of the test person.

It should be noted that, as those skilled in the art may understand, channel parameters of the RF transmitter coil, which is used in acquiring the mapping relation between the distribution data of RF coil transmission field of each channel and the distribution data of RF electric field of each channel, are the same as channel parameters of the RF transmitter coil of the MRI system, by which the magnetic resonance examination is performed on the test person is undergoing. For example, if the number of the channels of the RF coil, which is used in acquiring the mapping relation between the distribution data of RF coil transmission field of each channel and the distribution data of RF electric field of each channel, is 8, then the number of the channels of the RF transmitter coil of the MRI system, by which the magnetic resonance examination is performed on the test person, is 8 as well. If the number of the channels of the RF coil, which is used in acquiring the mapping relation between the distribution data of RF coil transmission field of each channel and the distribution data of RF electric field of each channel, is 4, then the number of the channels of the RF transmitter coil of the MRI system, by which the magnetic resonance examination is performed on the test person, is 4 as well, and so on. In other words, the number of the channels of the RF transmitter coil used in acquiring the mapping relation is the same as the number of the channels of the RF transmitter coil of the MRI system by which the magnetic resonance examination is performed on the test person is undergoing. It should be understood for those skilled in the art that the above description is merely illustrative but not a limitation on the present disclosure. For example, one of the channel parameters of the RF transmitter coil includes at least one of the number of the channels, a duration of an RF transmission of each channel, a flip angle of the RF transmission, the amplitude or phase of the impulse of the RF transmission, etc.

In addition, it should be noted that this disclosure does not limit the expression of the mapping relation between the distribution data of RF coil transmission field of each channel and the distribution data of RF electric field of each channel of the RF transmitter coil. For example, in some of the embodiments, the mapping relation may be expressed by a function:

$$E_i = F_i(B_i1+)$$

In the function, i denotes a channel number of the RF transmitter coil, $E_i$ denotes the distribution data of RF electric field of an i-th channel, $F_i$ denotes the mapping relation between the distribution data of RF coil transmission field of the i-th channel and the distribution data of RF electric field of the i-th channel, and $B_i1+$ denotes the distribution data of RF coil transmission field of the i-th channel. The mapping relation set is a set of all mapping relations between the distribution data of the RF coil transmission field of all channels of the RF transmitter coil and the distribution data of RF electric field of all channels of the RF transmitter coil. In some other embodiments, the mapping relation may also be the RF electric field prediction model trained in advance, and may predict the distribution data of RF electric field of the channel based on a specific channel number and the distribution data of RF coil transmission field of the specific channel. For more details, please refer to the relevant description hereinafter, which is not described in detail here.

In one of the embodiments, referring to FIG. 2, FIG. 2 is a schematic flow chart of obtaining an RF electric field prediction model according to an embodiment of the present disclosure. As shown in FIG. 2, the obtaining the trained RF electric field prediction model includes the following steps S101 to S103.

In step S101, a human-model data set is constructed.

In step S102, second distribution data of RF coil transmission field of each channel and second distribution data of RF electric field of each channel for each human model are obtained through simulation based on the constructed human-model data set and a channel parameter of the RF transmitter coil to obtain a training data set.

In step S103, an RF electric field prediction model is constructed and trained according to the training data set until a preset condition for an end of training is met to obtain the trained RF electric field prediction model.

In such a configuration of the SAR value acquisition method in MRI provided by this embodiment, during the training of the RF electric field prediction model, the training data set is obtained through simulation based on the constructed human-model data set, therefore, enough typical human models that may fully cover any size range of human body may be selected as needed during the construction of the human-model data set, thereby improving the generalization of the trained RF electric field prediction model. Then, by using the constructed human-model data set and the existing three-dimensional (3D) medical electromagnetic simulation software for human tissue, the second distribution data of RF coil transmission field (B1+) of each channel and the second distribution data of RF electric field (E filed) of each channel for each human model are obtained through simulation, according to the channel parameter of the RF transmitter coil, for example, the number of the channels when the RF transmitter coil transmit is a multi-channel transmitter coil, thus guaranteeing the number of the samples and the diversity of the samples in the training data set required for training the RF electric field prediction model based on the second distribution data of RF coil transmission field (B1+) and the second distribution data of RF electric field (E), and making the trained RF electric field prediction model have better generalization and higher prediction accuracy, that is, the obtained mapping relation between the distribution data of RF coil transmission field and the distribution data of RF electric field may be applied to various test persons, such as test persons of various ages, test persons with various body shapes, etc.

It should be noted that, the present disclosure is not intended to limit the specific manner of step S102 of obtaining the second distribution data of RF coil transmission field of each channel and the second distribution data of RF electric field of each channel for each human model through simulation based on the constructed human-model data set and the channel parameter of the RF transmitter coil to obtain the training data set. For example, in some embodiments, the human-model data set may be imported into the 3D medical electromagnetic simulation software for human tissue to obtain the training data set.

In some embodiments, each human model in the human-model data set includes electromagnetic parameters of human tissue. Correspondingly, the step S101 of constructing the human-model data set includes step S1011 to step S1014.

In step S1011, electromagnetic parameters of human tissues of at least two typical human models selected from a human-model library are obtained.

In step S1012, the electromagnetic parameters of human tissue of the at least two typical human models are augmented, a new human model is constructed based on the augmented electromagnetic parameters, and the new human model is added in the typical human models.

In S1013, steps of augmenting the electromagnetic parameters of human tissue of the at least two typical human models, constructing the new human model based on the augmented electromagnetic parameters, and adding the new human model in the typical human models are executed iteratively, until a preset target for constructing human models is satisfied.

In S1014, the human-model data set is obtained based on the typical human models.

In such a configuration of the SAR value acquisition method in MRI provided by this embodiment, based on the existing typical human models, for example, based on 12 sets of human models in an existing human-model library Virtual Population (ViP3.1), more human models are obtained through augmentation which includes but is not limited to interpolation, stretching, deformation, and other operations, and the constructed human-model data set may cover all preset typical human bodies.

It should be noted that the preset target for constructing the human models is not limited in the present disclosure. For example, the preset target for constructing the human models may be the number of the human models, such as the respective numbers of human models of infants, human models of preschoolers, human models of juveniles, human models of young and middle-aged persons, human models of elderly persons. In some embodiments, in order to improve the diversity and difference of the data set, in step S1011, electromagnetic parameters of a certain number of typical human models should be acquired from the human-model library. For example, in order to obtain more human models through interpolation, at least two sets of electromagnetic parameters of typical human models should be acquired from the human-model library. For example, in one of the embodiments, based on twelve human models in the human-model library ViP3.1, multiple human models may be obtained by interpolation, stretching, etc. Specifically, as shown in Table 1 below, fifteen human models are obtained.

TABLE 1

Illustration of fifteen Human Models

| Name | Gender | Age (Unit: year) | Height (m) | Weight (kg) | BMI (kg/m²) |
|------|--------|------------------|------------|-------------|-------------|
| Bille | Female | 11 | 1.49 | 34 | 15.3 |
| Duke | Male | 34 | 1.77 | 70.2 | 22.4 |
| Duke105 | Male | 34 | 1.86 | 81.27 | 23.5 |
| Eartha | Female | 8 | 1.36 | 29.9 | 16.2 |
| Ella | Female | 26 | 1.63 | 57.3 | 21.6 |
| Ella105 | Female | 26 | 1.71 | 66.33 | 22.6 |
| Ella26 | Female | 26 | 1.63 | 69.4 | 26.1 |
| Ella30 | Female | 26 | 1.63 | 79.7 | 30 |
| Ella95 | Female | 26 | 1.55 | 49.13 | 20.5 |
| Fats | Male | 37 | 1.82 | 101.15 | 30.5 |

TABLE 1-continued

Illustration of fifteen Human Models

| Name | Gender | Age (Unit: year) | Height (m) | Weight (kg) | BMI (kg/m²) |
|------|--------|------------------|------------|-------------|-------------|
| Glenn | Male | 84 | 1.73 | 61.1 | 20.4 |
| Jeduk | Male | 33 | 1.62 | 64.5 | 24.6 |
| Louis | Male | 14 | 1.68 | 49.7 | 17.6 |
| Thelonious | Male | 6 | 1.16 | 18.6 | 13.8 |
| Yoon-sun | Female | 26 | 1.52 | 54.6 | 23.6 |

Obviously, it should be understood for those skilled in the art that the above table is only illustrative, and the typical human bodies in the human-model library may be augmented to obtain more human models, but it does not mean or imply that there are only fifteen examples of human models.

Specifically, as described above, in the present disclosure, the electromagnetic parameters of the human tissue are used to represent the human model, namely, the digital representation of the human tissue, which lays a foundation for the augmentation of the human model by means of, such as interpolation and/or stretching the electromagnetic parameters. Moreover, the electromagnetic parameters of different human tissues are not the same, therefore, the three-dimensional digitization of human tissue may be achieved in form of the electromagnetic parameters of the human tissue, so that the first distribution data of RF electric field of each channel during the examination of the test person can be obtained only according to the first distribution data of RF coil transmission field of a channel during the examination of the test person, without considering the physical information of the test person, such as gender, age, weight, height, etc.

In some embodiments, one of the electromagnetic parameters of human tissue includes, but are not limited to, at least one of a dielectric constant, an electrical conductivity, or a magnetic permeability of human tissue. During the augmentation of human model, a new human model may be constructed by interpolation and/or stretching the dielectric constant, electrical conductivity, and/or magnetic permeability of different human tissues.

This disclosure does not limit how to present the three-dimensional digitization of human model by using electromagnetic parameters. For example, if electromagnetic parameters are used to represent the whole-body human tissues of the human model, during the communication, the electrical conductivities of the tissues of the human body have the greatest impact on the effects of the signal transmission. Among common human tissues, bones, muscles, and fat are good conductors within a human body communication frequency range. It is also considered that human tissues of different sizes each have a non-negligible impact on signal transmission, therefore, in some embodiments, after the digitization of the head, trunk, and limbs of the human body is achieved by electromagnetic parameters, the digitized head, trunk, and limbs of the human body are spliced according to a geometric structure of the human body. Furthermore, during the digitization of the human body by means of electromagnetic parameters, the head of the human body is divided into five layers including skin, fat, muscle, bone, and brain, which are represented by the first set of electromagnetic parameters respectively. The body tissue structure is divided into five layers including skin, fat, muscle, bone, and internal organs (such as lungs, heart, liver, kidneys, etc.), which are represented by the second set of electromagnetic parameters respectively. The human tissues of the human limbs are divided into four layers including skin, fat, muscle, and bone, which are represented by the third set of electromagnetic parameters respectively, thus further improving the accuracy of the electromagnetic parameters of the human model, and laying the foundation for improving the simulation accuracy of the 3D medical electromagnetic simulation software for human tissue.

It should be noted that this disclosure does not limit the 3D medical electromagnetic simulation software for human tissue. In practical applications, the 3D medical electromagnetic simulation software for human tissue may be Sim4Life or CST, alternatively, may also be any other 3D medical electromagnetic simulation software for human tissue other than Sim4Life or CST, or may be self-constructed 3D medical electromagnetic simulation software for human tissue, which will not be listed herein.

In addition, as may be understood by those skilled in the art, the step S1013 of iteratively executing steps of performing the augmentation on the electromagnetic parameters of the human tissue of the typical human model and/or of the newly constructed human model, and constructing the new human model based on the augmented electromagnetic parameters until the preset target for constructing the human models is satisfied, means that, step S1011 and step S1012 are executed repeatedly until the preset target for constructing the human models is satisfied, for example, until the number of the human models reaches the preset number. In some embodiments, when the augmentation of the typical human models is performed by step S1011 and step S1012, as the new human models are added in the typical human models, the augmentation may be performed on the electromagnetic parameters of human tissue of the typical human models originally selected from the human-model library. In some embodiments, the preset number for the number of the human models may be preset according to experience, for example, may be preset to be 12. In some embodiments, the augmentation may be performed on the electromagnetic parameters of human tissue of the new human models added in the typical human models. In some embodiments, the augmentation may be performed not only on the electromagnetic parameters of the human tissue of the typical human model originally selected from the human-model library, but also on the electromagnetic parameters of the human tissue of the new human model added in the typical human models, which are not limited in the present disclosure. Further, in one of the exemplary embodiments, step S102 of obtaining the second distribution data of RF coil transmission field of each channel and the second distribution data of RF electric field of each channel for each human model through simulation based on the constructed human-model data set and the channel parameter of the RF transmitter coil to obtain the training data set, includes steps S1021 to S1023.

In step S1021, the number of scan segments and a scan part corresponding to each of the scan segments of each human model are determined according to dimensions of the RF transmitter coil.

In step S1022, segmented scans are performed on each human model according to the channel parameter of the RF transmitter coil, the number of the scan segments of each human model and the scan part corresponding to each of the scan segments, to obtain third distribution data of RF coil transmission field and third distribution data of RF electric field of the scan part corresponding to each scan segment of each human model.

In step S1023, the second distribution data of RF coil transmission field of each channel and the second distribution data of RF electric field of each channel for all tissues of each human model are obtained based on the third distribution data of RF coil transmission field and the third distribution data of RF electric field of the scan part corresponding to each scan segment of each human model. In an embodiment, the second distribution data of RF coil transmission field of each channel and the second distribution data of RF electric field of each channel for all tissues of each human model are obtained by merging the third distribution data of RF coil transmission field and the third distribution data of RF electric field of the scan part corresponding to each scan segment of each human model according to a sequence of scan segments of each human model.

In such a configuration of the SAR value acquisition method in MRI provided by this embodiment, the second distribution data of RF coil transmission field of each channel and the second distribution data of RF electric field of each channel for all tissues of each human model may be obtained through segmented scans based on the dimensions of the RF transmitter coil. It may be seen that the present invention has good universality. For example, the dimensions of the RF transmitter coil are not limited, and the invention may be applied to both large-sized and small-sized RF transmitter coils. Furthermore, the present invention does not limit the field strength range of the RF transmitter coil either, which may be, for example, 1.5 T, 3 T, 5 T, 7 T, 9.4 T, or other values.

Referring to FIG. 3, FIG. 3 shows images illustrating scan segments according to an embodiment of the present disclosure. As shown in FIG. 3, in this embodiment, the RF transmitter coil is an 8-channel VTC coil of 5 T. Considering that the size of the coil is small, in this embodiment, the human body is divided into three scan segments based on the height. In FIG. 3, the scan parts corresponding to the three scan segments in the images from left to right are the head, the trunk, and the lower limbs respectively, such that the second distribution data of RF coil transmission field and the second distribution data of RF electric field of eight channels of all human tissues of each human model may be obtained through segmented scans.

Further, in step S102, the number of the samples in the training data set is a product of the number of human models and the number of channels of the RF transmitter coil, and each sample is a data pair comprising the second distribution data of RF coil transmission field of a corresponding channel and the second distribution data of RF electric field of a corresponding channel. In addition, as can be understood by those skilled in the art, the training process of the model is actually a process of minimizing the loss function. Therefore, the preset condition for the end of training may be that the value of the loss function does not change any longer, for example, parameters of the RF electric field prediction model converge to meet an error requirement, or may be that a set stop condition is satisfied, for example, the number of times of training reaches the preset number. At this time, the parameters of the RF electric field prediction model are saved to obtain the trained RF electric field prediction model.

In one of the exemplary embodiments, the RF electric field prediction model in step S103 includes a generative adversarial networks model, and the step S103 includes determining the loss function for training the RF electric field prediction model according to a standard loss function of the generative adversarial networks model and the priori knowledge of the electromagnetic field.

In such a configuration of the SAR value acquisition method in MRI provided by this embodiment, in the process of training the RF electric field prediction model, the loss function is jointly determined by the standard loss function of the generative adversarial networks model and the priori knowledge of the electromagnetic field, thereby further improving the prediction accuracy of the RF electric field prediction model.

It should be noted that, the type of the RF electric field prediction model is not limited in the present disclosure, the RF electric field prediction model may be a CycleGAN or a Unet networks model, or any networks model other than CycleGAN and Unet networks model, which are not listed herein. In addition, the specific structure of the RF electric field prediction model may be understood by referring to technology known to those skilled in the art, and will not be described repeatedly hereinafter.

In one of the embodiments, the priori knowledge of the electromagnetic field may be expressed by the following Maxwell equation:

$$\nabla \times \vec{B}(\vec{r}, t) = \sigma \ \mu \ \vec{E}(\vec{r}, t) + \varepsilon \mu \frac{\partial \vec{E}(\vec{r}, t)}{\partial t}$$

$$\nabla \times \vec{E}(\vec{r}, t) = -\frac{\partial \vec{B}(\vec{r}, t)}{\partial t}$$

where, $\vec{E}$ represents the electric field, $\vec{B}$ represents the magnetic flux density which may be obtained by scanning the human body through the magnetic resonance system, $\varepsilon$ represents the dielectric constant of the human tissue, $\sigma$ represents the conductivity of the human tissue, and $\mu$ represents the magnetic permeability of the human tissue.

Specifically, in order to determine the loss function for training the RF electric field prediction model, the weight of the standard loss function of the generative adversarial networks model and the weight of the priori knowledge of the electromagnetic field may be reasonably set according to actual needs. For example, the total weight of the loss function for training the RF electric field prediction model is 1. In some embodiments, the weight of the standard loss function and the weight of the electromagnetic field priori knowledge are both 0.5. In other embodiments, the weight of the standard loss function may be 0.3, and the weight of the electromagnetic field priori knowledge may be 0.7. In some embodiments, the weight of the standard loss function may be 0.4, and the weight of the electromagnetic field priori knowledge may be 0.6, etc., which will not be described one by one.

In such a configuration, the determined first distribution data of RF electric field is accurate to each channel of the RF transmitter coil, thereby laying a solid foundation for adjusting the weight of a channel corresponding to the first distribution data of RF electric field of each channel according to the first distribution of the RF electric field of each channel during the examination of the test person, thereby achieving the purpose of determining the optimal distribution of SAR values, namely obtaining the distribution of SAR values with high accuracy.

It should be understood for those skilled in the art that for each channel of the RF transmitter coil on the test person, there are first distribution data of RF electric field corresponding to the first distribution data of RF coil transmission field. Therefore, in this text, the first distribution data of RF electric field of each channel corresponding to the test person means the first distribution data of RF electric field of each channel during the examination of the test person.

In one of the exemplary embodiments, the step S400 of adjusting the weight of each channel corresponding to the first distribution data of RF electric field of each channel according to the first distribution data of RF electric field of each channel acquired during the examination of the test person, and determining the distribution of SAR values of the test person, includes: adjusting at least one of the amplitude or the phase of the impulse of the RF transmission of the channel corresponding to the first distribution data of RF electric field of each channel according to the first distribution data of RF electric field of each channel acquired during the examination of the test person, and determining the distribution of SAR values of the test person.

In such a configuration of the SAR value acquisition method in MRI provided by this embodiment, the amplitude and the phase of the impulse of the RF transmission of the channel corresponding to the first distribution data of RF electric field of each channel are adjusted according to the first distribution data of RF electric field of each channel acquired during the examination of the test person, thereby obtaining the optimal distribution of SAR values of the test person namely obtaining the distribution of SAR values with high accuracy, and ensuring the safety of the test person.

It should be understood by those skilled in the art that, since the first distribution data of RF electric field are accurate to each channel of the coil, the weight of each channel may be adjusted according to the first distribution data of RF electric field of each channel. The weights include but are not limited to the amplitude and the phase of the impulse of the corresponding channel, so as to obtain the optimal distribution of the SAR values.

Referring to FIG. 4, FIG. 4 shows images of electric field (E field) distribution of two test persons, which are obtained by using the SAR value acquisition method provided by an embodiment of the present disclosure. In FIG. 4, values of the vertical and horizontal coordinates represent pixel distances, and different gray levels in the grayscale bar represent different RF energy values. As may be seen from FIG. 4, the RF energy obtained by using the SAR value acquisition method in MRI provided by the present disclosure is within a safe range.

Figure 5:
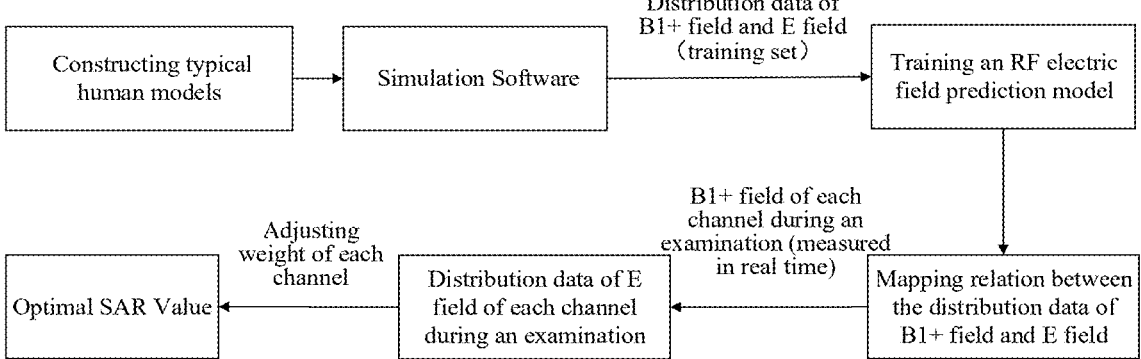
FIG. 5 is a diagram illustrating the SAR value acquisition method according to an embodiment of the present disclosure.

Referring to FIG. 5, FIG. 5 is a diagram illustrating the SAR value acquisition method according to an embodiment of the present disclosure. As shown in FIG. 5, in this embodiment, firstly, typical human models are constructed to obtain the human-model data set. Then, the obtained human-model data set is imported into the simulation software, and the second distribution data of RF coil transmission field of each channel and the second distribution data of RF electric field of each channel for each human model are obtained through simulation to obtain the training data set. Then the RF electric field prediction model is constructed and trained to obtain the mapping relation between the distribution data of RF coil transmission field (B1+) of each channel and the distribution data of RF electric field (E field), and the mapping relation set is obtained. On this basis, the first distribution data of RF electric field (E field) of each channel are obtained during the examination of the test person according to the mapping relation set and the first distribution data of RF coil transmission field (B1+) of each channel tested in real time during the examination of the test person. Finally, the optimal SAR value of the test person may be obtained by adjusting the weight of each channel based on the first distribution data of RF electric field of each channel acquired during the examination of the test person. In summary, in the SAR value acquisition method in MRI provided by this disclosure, firstly, the mapping relation between the distribution data of RF coil transmission field (B1+) of each channel and the distribution data of RF electric field (E) of each channel is acquired to obtain the mapping relation set, which lays the solid foundation for subsequently obtaining the real-time first distribution data of RF electric field of each channel when the test person is undergoing a magnetic resonance examination based on the acquired first distribution data of RF coil transmission field of each channel. Furthermore, the first distribution data of RF electric field obtained by this disclosure are accurate to each channel of the RF transmitter coil, so that the weight of the channel corresponding to the first distribution data of RF electric field may be adjusted in real time according to the first distribution data of RF electric field, for example, according to a superposition principle of the RF electric field and the weight of each channel, the amplitude and the phase of the RF transmission impulse of each channel are adjusted for the purpose of obtaining the optimal SAR values, thereby achieving the optimal distribution of the SAR values namely obtaining the distribution of SAR values with high accuracy, and ensuring the safety of the test person.

An embodiment of the present disclosure also provides an MRI system. Specifically, during imaging, the MRI system acquires a distribution of SAR values through an SAR value acquisition device or the SAR value acquisition method in MRI of any of the embodiments above.

Figure 6:
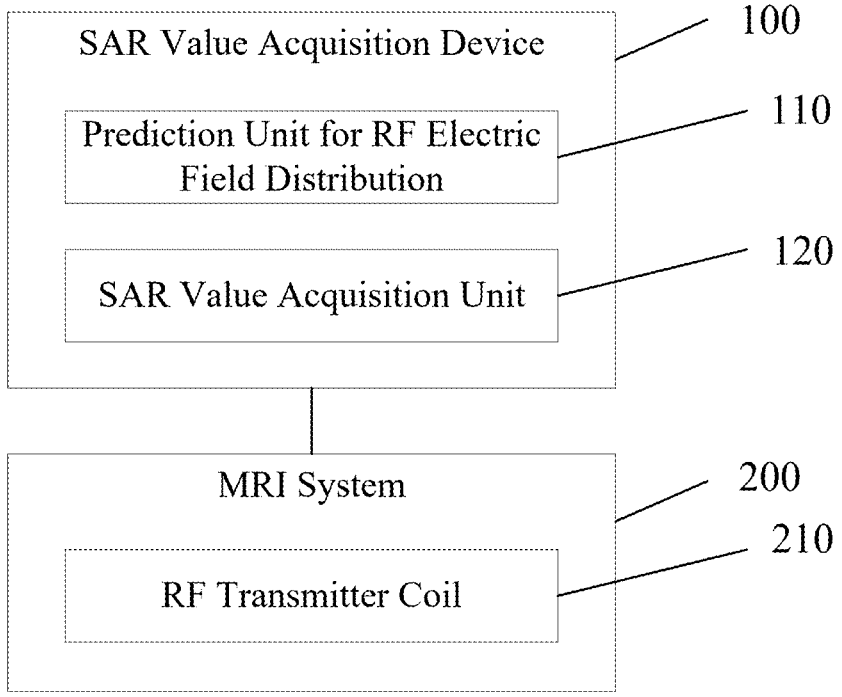
FIG. 6 is a block diagram illustrating a structure of an MRI system according to an embodiment of the present disclosure.

Specifically, referring to FIG. 6, FIG. 6 is a block diagram illustrating a structure of an MRI system according to an embodiment of the present disclosure. As shown in FIG. 6, the SAR value acquisition device 100 includes: a prediction unit for RF electric field distribution 110 and an SAR value acquisition unit 120.

More specifically, the prediction unit for RF electric field distribution 110, is configured to acquire a mapping relation between distribution data of RF coil transmission field of each channel and distribution data of RF electric field of each channel of an RF transmitter coil, and to obtain a mapping relation set. The SAR value acquisition unit 120 is configured to acquire first distribution data of RF coil transmission field of each channel during an examination of a test person. The SAR value acquisition unit 120 is further configured to determine first distribution data of RF electric field of each channel during the examination of the test person according to the first distribution data of RF coil transmission field of each channel and the mapping relation set. The SAR value acquisition unit 120 is further configured to adjust a weight of each channel corresponding to the first distribution data of RF electric field of each channel according to the first distribution data of RF electric field of each channel acquired during the examination of the test person, and to determine a distribution of SAR values of the test person.

As the MRI system provided by this embodiment has the same inventive concepts as the SAR value acquisition method in MRI above, the MRI system provided by this embodiment at least has the advantages of the SAR value acquisition method in MRI above, which will not be described repeatedly, so as to avoid repeated description. For more details, please refer to the description related to the SAR value acquisition method in MRI described above.

Further, the MRI system may further include an imaging device 200, a bed (not shown in the figure), a display device (not shown in the figure), and an input and output device (not shown in the figure), etc. The imaging device 200 may further include an RF transmitter coil 210. In one of the exemplary embodiments, the RF transmitter coil of the MRI system includes a multi-channel array transmitter coil, a full volume transmitter coil, or a partial volume transmitter coil. The field strength range of the RF transmitter coil is greater than or equal to 3 T.

It should be noted that for contents related to the imaging device, the bed, the display device, and the input and output device, please refer to the contents known to those skilled in the art, which will not be repeated here.

Figure 7:
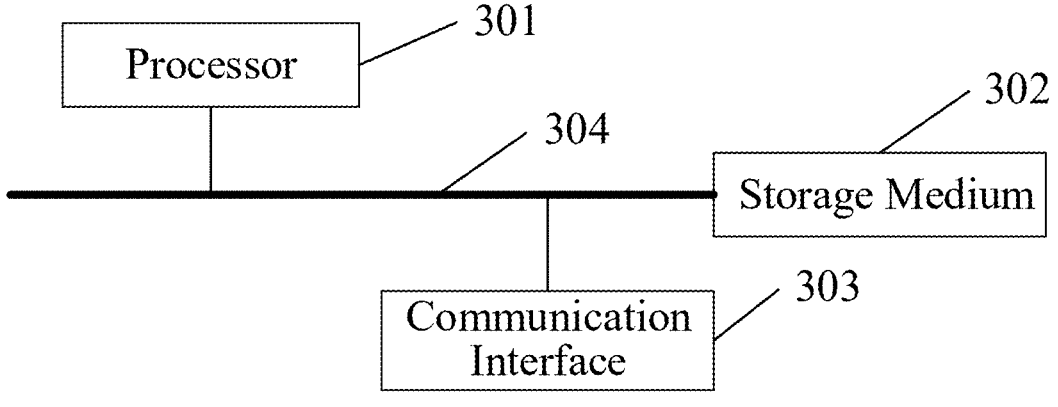
FIG. 7 is a block diagram illustrating a structure of an electronic apparatus according to an embodiment of the present disclosure.

An embodiment of the present disclosure provides an electronic apparatus. Referring to FIG. 7, FIG. 7 is a block diagram illustrating a structure of an electronic apparatus according to an embodiment of the present disclosure. As shown in FIG. 7, the electronic apparatus includes a processor 301 and a storage medium 302. A computer program is stored on the storage medium 302. The processor 301, when executing the computer program, executes the SAR value acquisition method in MRI above.

As the electronic apparatus provided by this embodiment has the same inventive concepts as the SAR value acquisition method in MRI above, the electronic apparatus provided by this embodiment at least has the advantages of the SAR value acquisition method in MRI above, which will not be described repeatedly, so as to avoid repeated description. For more details, please refer to the description related to the SAR value acquisition method in MRI described above.

As shown in FIG. 7, the electronic apparatus further includes a communication interface 303 and a communication bus 304. The processor 301, the communication interface 303, and the storage medium 302 communicate with each other through the communication bus 304. The communication bus 304 may be a Peripheral Component Interconnect (PCI) bus or an Extended Industry Standard Architecture (EISA) bus, etc. The communication bus 304 may be divided into an address bus, a data bus, a control bus, etc. For ease of presentation, only one thick line is used in the figure, which does not mean that there is only one bus or one type of bus. The communication interface 303 is configured to communicate with the above electronic apparatus and other devices.

The processor 301 in this disclosure may be a central processing unit (CPU), or any other general processor, digital signal processor (DSP), application specific integrated circuit (ASIC), existing field-programmable gate array (FPGA), or any other programmable logic devices, discrete gate or transistor logic device, discrete hardware component, etc. The general processor may be a microprocessor, or the processor may be any conventional processor, etc. The processor 301 is the control center of the electronic apparatus and is connected with various parts of the electronic apparatus by means of various interfaces and circuitries.

The storage medium 302 is configured to store the computer program. The processor 301 implements various functions of the electronic apparatus by running or executing the computer program stored in the storage medium 302 and calling the data stored in the storage medium 302.

The storage medium 302 may include non-volatile and/or volatile memory. Non-volatile memory may include read-only memory (ROM), programmable ROM (PROM), electrically programmable ROM (EPROM), electrically erasable programmable ROM (EEPROM), or flash memory.

Volatile memory may include random access memory (RAM) or external cache memory. As illustration and not limitation, RAM is available in many forms, such as static RAM (SARM), dynamic RAM (DRAM), synchronous DRAM (SDRAM), double data rate SDRAM (DDRS-DRAM), enhanced SDRAM (ESDRAM), sync link DRAM (SLDRAM), rambus direct RAM (RDRAM), direct rambus dynamic RAM (DRDRAM), and rambus dynamic RAM (RDRAM), etc.

An embodiment of the present disclosure also provides a non-transitory computer-readable storage medium. A computer program is stored on the non-transitory computer-readable storage medium. The computer program, when being executed by the processor, causes the processor to execute steps of the SAR value acquisition method in MRI above.

As the non-transitory computer-readable storage medium provided by this embodiment has the same inventive concepts as the SAR value acquisition method in MRI above, the non-transitory computer-readable storage medium provided by this embodiment at least has the advantages of the SAR value acquisition method in MRI above, which will not be described repeatedly, so as to avoid repeated description. For more details, please refer to the description related to the SAR value acquisition method in MRI described above.

The non-transitory computer-readable storage medium in the embodiment of the present disclosure may be any combination of one or more computer-readable storage medium. The non-transitory computer-readable storage medium may be computer-readable signal medium or computer-readable storage medium. The computer-readable storage medium may be, for example, but is not limited to, an electrical, magnetic, optical, electromagnetic, infrared or semiconductor system, device or device, or any combination thereof. More specific examples (non-exhaustive list) of non-transitory computer-readable storage medium include: electrical connection with one or more wires, portable computer hard drive, hard disk, random access memory (RAM), read-only memory (ROM), erasable programmable read-only memory (EPROM or flash memory), fiber optic, portable compact disk read-only memory (CD-ROM), optical memory, magnetic memory, or any suitable combination thereof. In the text, a computer-readable memory may be any tangible medium that contains or stores a program that may be used by an instruction execution system, an apparatus, or a device, or a combination thereof.

A computer-readable signal medium may include a data signal in baseband or propagated as part of a carrier wave, and has computer-readable program codes stored thereon. Such data signals may be propagated in many forms, including but not limited to electromagnetic signals, optical signals, or any suitable combination thereof. The computer-readable signal medium may also be any computer-readable medium other than a computer-readable storage medium, and the computer-readable medium may send, propagate, or transmit a program to be used by an instruction execution system, an apparatus, or device, or a combination thereof.

The computer program codes performing the operations of the present disclosure may be written in one or more programming languages or a combination thereof. The programming languages include object-oriented programming languages such as Java, Smalltalk, C++, and a conventional procedural programming language, such as "C" or similar programming language. The program codes may be executed entirely on the user's computer, executed partly on the user's computer, executed as a separate software package, executed partly on the user's computer and partly on a remote computer, or executed entirely on the remote computer or server. In situations involving remote computers, the remote computer may be connected to the user's computer through any kind of network, including a local area network (LAN) or a wide area network (WAN), or may be connected to an external computer (for example, through Internet by means of Internet server provider).

In summary, compared with the existing technology, the SAR value acquisition method in MRI, the SAR value acquisition system, the electronic apparatus, and non-transitory computer-readable storage medium provided by the present disclosure have the following advantages: in the SAR value acquisition method in MRI provided by the present disclosure, the mapping relation between the distribution data of RF coil transmission field (B1+) of each channel and the distribution data of RF electric field (E) of each channel is pre-acquired, which laid a solid foundation for obtaining the first distribution data of RF electric field in real time during a subsequent magnetic resonance examination of the test person based on the acquired first distribution data of RF electric field. Furthermore, the first distribution data of RF electric field obtained in this embodiment are accurate to each channel of the RF transmitter coil, so that the weight of each channel corresponding to the first distribution data of RF electric field of each channel may be adjusted in real time according to the first distribution data of RF electric field of each channel, for example, for the purpose of obtaining the optimal SAR value, an amplitude and a phase of the impulse of each channel are adjusted according to a superposition principle of the RF electric field and the weight of each channel, thereby achieving the optimal distribution of the SAR values, namely obtaining the distribution of the SAR values with a high accuracy, and ensuring the safety of the test person.

Since the SAR value acquisition system in MRI, the electronic apparatus, and the non-transitory computer-readable storage medium provided by the present disclosure have the same inventive concepts as the SAR value acquisition method in MRI provided by the present disclosure, they at least have the same beneficial effects, which will not be described repeatedly here.

It should be noted that the devices and methods disclosed in the embodiments of this text may also be implemented in other ways. The device embodiments described above are only illustrative. For example, the flowcharts and block diagrams in the accompanying drawings show the possible architectures, functions and operations that may be realized by the devices, methods and computer program products according to various embodiments of the text. Each block in the flowchart or block diagram may represent part of a module, program, or codes. The part of the module, program, or codes includes one or more executable functions for implementing specified logical functions. It should also be noted that, in some alternative embodiments, the functions noted in the blocks may be implemented in an order other than that noted in the figure. For example, two consecutive blocks may actually be executed substantially in parallel, and sometimes they may be executed in a reverse order, which depends on the functions executed. It should also be noted that each block in the block diagram and/or in the flow chart, and a combination of blocks in the block diagram and/or in the flow chart, may be realized by a dedicated hardware-based system that is configured to perform specified functions or actions, or may be realized by using a combination of specialized hardware and computer instructions.

In addition, various functional modules of each embodiment in this text may be integrated together to form an independent part, or may be arranged separately from each other, or one or two functional modules may be integrated to form an independent part.

Embodiments described above are only some examples of the present disclosure, but not intended to limit the scope of the present disclosure. Various changes or modifications made by those of ordinary skill in the art of the present disclosure based on the above disclosure will all fall within the scope of the present disclosure. Obviously, for those skilled in the art, various changes and modifications may be made without departing from the spirits and the scope of the present disclosure. Thus, if these changes and modifications fall within the scope of the present disclosure and equivalent technologies thereof, the present disclosure is also intended to include these changes and modifications.

What is claimed is:

1. A specific absorption rate (SAR) value acquisition method in magnetic resonance imaging (MRI), comprising:

acquiring a mapping relation between distribution data of radio frequency (RF) coil transmission field of each channel of an RF transmitter coil and distribution data of RF electric field of each channel of the RF transmitter coil, and obtaining a mapping relation set;

acquiring first distribution data of RF coil transmission field of each channel during an examination of a test person;

determining first distribution data of RF electric field of each channel during the examination of the test person according to the first distribution data of RF coil transmission field of each channel and the mapping relation set; and adjusting a weight of each channel according to the first distribution data of RF electric field of each channel acquired during the examination of the test person, and determining a distribution of SAR values of the test person;

wherein the adjusting the weight of each channel according to the first distribution data of RF electric field of each channel acquired during the examination of the test person, comprises:

adjusting at least one of an amplitude or a phase of an impulse of RF transmission of a channel corresponding to the first distribution data of RF electric field of each channel, according to the first distribution data of RF electric field of each channel acquired during the examination of the test person.

2. The SAR value acquisition method in MRI of claim 1, wherein the mapping relation between the distribution data of radio frequency (RF) coil transmission field of each channel of the RF transmitter coil and the distribution data of RF electric field of each channel of the RF transmitter coil is a trained RF electric field prediction model.

3. The SAR value acquisition method in MRI of claim 2, wherein acquiring the trained RF electric field prediction model comprises:

constructing a human-model data set;

obtaining second distribution data of RF coil transmission field of each channel and second distribution data of RF electric field of each channel for each human model through simulation, based on the constructed human-model data set and a channel parameter of the RF transmitter coil, to obtain a training data set; and constructing and training an RF electric field prediction model according to the training data set until a preset condition for an end of training is met, and obtaining the trained RF electric field prediction model.

4. The SAR value acquisition method in MRI of claim 3, wherein:

each human model in the human-model data set comprises electromagnetic parameters of human tissue; and the constructing the human-model data set comprises:

obtaining electromagnetic parameters of human tissue of at least two typical human models selected from a human-model library;

augmenting the electromagnetic parameters of human tissue of the at least two typical human models, constructing a new human model based on the augmented electromagnetic parameters, and adding the new human model in the typical human models; and executing iteratively steps of: performing the augmentation processing on the electromagnetic parameters of human tissue of the at least two typical human models, constructing the new human model based on the augmented electromagnetic parameters, and adding the new human model in the typical human models, until a preset target for constructing human models is satisfied; and obtaining the human-model data set based on the typical human models.

5. The SAR value acquisition method in MRI of claim 4, wherein one of the electromagnetic parameters of human tissue comprises at least one of a dielectric constant, an electrical conductivity, or a magnetic permeability of the human tissue.

6. The SAR value acquisition method in MRI of claim 4, wherein the preset target for constructing the human models is a preset number of human models.

7. The SAR value acquisition method in MRI of claim 3, wherein, the obtaining the second distribution data of RF coil transmission field of each channel and the second distribution data of RF electric field of each channel for each human model through simulation, based on the constructed human-model data set and the channel parameter of the RF transmitter coil, to obtain the training data set, comprises:

determining the number of scan segments and a scan part corresponding to each of the scan segments of each human model according to dimensions of the RF transmitter coil;

performing segmented scans on each human model according to the channel parameter of the RF transmitter coil, the number of the scan segments of each human model, and the scan part corresponding to each of the scan segments, and obtaining third distribution data of RF coil transmission field and third distribution data of RF electric field of the scan part corresponding to each scan segment of each human model; and obtaining the second distribution data of RF coil transmission field of each channel and the second distribution data of RF electric field of each channel for all tissues of each human model, based on the third distribution data of RF coil transmission field and the third distribution data of RF electric field of the scan part corresponding to each of the scan segments of each human model.

8. The SAR value acquisition method in MRI of claim 7, wherein one of the channel parameters of the RF transmitter coil comprises at least one of the number of channels, a duration of an RF transmission of each channel, a flip angle of the RF transmission, an amplitude of an impulse of the RF transmission, or a phase of the impulse of the RF transmission.

9. The SAR value acquisition method in MRI of claim 3, wherein:

the RF electric field prediction model comprises a generative adversarial networks model; and the constructing and training the RF electric field prediction model comprises:

determining a loss function for training the RF electric field prediction model, according to a standard loss function of the generative adversarial networks model and priori knowledge of electromagnetic field.

10. The SAR value acquisition method in MRI of claim 3, wherein the number of samples in the training data set is a product of the number of human models and the number of channels of the RF transmitter coil, and each of the samples is a data pair comprising the second distribution data of RF coil transmission field of a corresponding channel and the second distribution data of RF electric field of the corresponding channel.

11. The SAR value acquisition method in MRI of claim 1, wherein the acquiring the mapping relation between the distribution data of RF coil transmission field of each channel of the RF transmitter coil and the distribution data of RF electric field of each channel of the RF transmitter coil, and the obtaining the mapping relation set comprise:

acquiring a trained RF electric field prediction model;

inputting the distribution data of RF coil transmission field of each channel of the RF transmitter coil into the trained RF electric field prediction model to predict and obtain the distribution data of RF electric field of each channel; and obtaining the mapping relation set based on the distribution data of RF coil transmission field of each channel and the distribution data of RF electric field of each channel.

12. The SAR value acquisition method in MRI of claim 1, wherein a field strength of the RF transmitter coil is 3T or 5T, and the RF transmitter coil has 8 channels.

13. A magnetic resonance imaging (MRI) system, comprising:

an imaging device comprising a radio frequency (RF) transmitter coil; and a specific absorption rate (SAR) value acquisition device, configured to perform the SAR value acquisition method in MRI of claim 1, and comprising:

a prediction unit for RF electric field distribution configured to: acquire the mapping relation between the distribution data of RF coil transmission field of each channel of the RF transmitter coil and the distribution data of RF electric field of each channel of the RF transmitter coil, and obtain the mapping relation set; and an SAR value acquisition unit configured to: acquire the first distribution data of RF coil transmission field of each channel during the examination of the test person; obtain the first distribution data of RF electric field of each channel during the examination of the test person according to the first distribution data of RF coil transmission field of each channel and the mapping relation set; and adjust the weight of each channel according to the first distribution data of RF electric field of each channel acquired during the examination of the test person, and determine the distribution of the SAR values of the test person.

14. The MRI system of claim 13, wherein the RF transmitter coil comprises a multi-channel array transmitter coil, a full volume transmitter coil, or a partial volume transmitter coil.

15. An electronic apparatus, comprising a processor, and a storage medium having a computer program stored thereon, wherein, the processor, when executing the computer program, performs steps of the SAR value acquisition method in MRI of claim 1.

16. The electronic apparatus of claim 15, wherein, the acquiring the mapping relation between the distribution data of RF coil transmission field of each channel of the RF transmitter coil and the distribution data of RF electric field of each channel of the RF transmitter coil, and the obtaining the mapping relation set comprise:

acquiring a trained RF electric field prediction model;

inputting the distribution data of RF coil transmission field of each channel of the RF transmitter coil into the trained RF electric field prediction model to predict and obtain the distribution data of RF electric field of each channel; and obtaining the mapping relation set based on the distribution data of RF coil transmission field of each channel and the distribution data of RF electric field of each channel.

17. A non-transitory computer-readable storage medium, having a computer program stored thereon, wherein, the computer program, when being executed by a processor, causes the processor to perform steps of the SAR value acquisition method in MRI of claim 1.

18. The non-transitory computer-readable storage medium of claim 17, wherein the acquiring the mapping relation between the distribution data of RF coil transmission field of each channel of an RF transmitter coil and the distribution data of RF electric field of each channel of the RF transmitter coil, and the obtaining the mapping relation set comprise:

acquiring a trained RF electric field prediction model;

inputting the distribution data of RF coil transmission field of each channel of the RF transmitter coil into the trained RF electric field prediction model to predict and obtain the distribution data of RF electric field of each channel; and obtaining the mapping relation set based on the distribution data of RF coil transmission field of each channel and the distribution data of RF electric field of each channel.

19. A specific absorption rate (SAR) value acquisition method in magnetic resonance imaging (MRI), comprising:

acquiring a mapping relation between distribution data of radio frequency (RF) coil transmission field of each channel of an RF transmitter coil and distribution data of RF electric field of each channel of the RF transmitter coil, and obtaining a mapping relation set;

acquiring first distribution data of RF coil transmission field of each channel during an examination of a test person;

determining first distribution data of RF electric field of each channel during the examination of the test person according to the first distribution data of RF coil transmission field of each channel and the mapping relation set; and adjusting a weight of each channel according to the first distribution data of RF electric field of each channel acquired during the examination of the test person, and determining a distribution of SAR values of the test person;

wherein the mapping relation between the distribution data of RF coil transmission field of each channel of the RF transmitter coil and the distribution data of RF electric field of each channel of the RF transmitter coil is a trained RF electric field prediction model;

wherein acquiring the trained RF electric field prediction model comprises:

constructing a human-model data set;

obtaining second distribution data of RF coil transmission field of each channel and second distribution data of RF electric field of each channel for each human model through simulation, based on the constructed human-model data set and a channel parameter of the RF transmitter coil, to obtain a training data set; and constructing and training an RF electric field prediction model according to the training data set until a preset condition for an end of training is met, and obtaining the trained RF electric field prediction model;

wherein each human model in the human-model data set comprises electromagnetic parameters of human tissue; and the constructing the human-model data set comprises:

obtaining electromagnetic parameters of human tissue of at least two typical human models selected from a human-model library;

augmenting the electromagnetic parameters of human tissue of the at least two typical human models, constructing a new human model based on the augmented electromagnetic parameters, and adding the new human model in the typical human models;

executing iteratively steps of: performing the augmentation processing on the electromagnetic parameters of human tissue of the at least two typical human models, constructing the new human model based on the augmented electromagnetic parameters, and adding the new human model in the typical human models, until a preset target for constructing human models is satisfied; and obtaining the human-model data set based on the typical human models.

20. A specific absorption rate (SAR) value acquisition method in magnetic resonance imaging (MRI), comprising:

acquiring a mapping relation between distribution data of radio frequency (RF) coil transmission field of each channel of an RF transmitter coil and distribution data of RF electric field of each channel of the RF transmitter coil, and obtaining a mapping relation set;

acquiring first distribution data of RF coil transmission field of each channel during an examination of a test person;

determining first distribution data of RF electric field of each channel during the examination of the test person according to the first distribution data of RF coil transmission field of each channel and the mapping relation set; and adjusting a weight of each channel according to the first distribution data of RF electric field of each channel acquired during the examination of the test person, and determining a distribution of SAR values of the test person;

wherein the mapping relation between the distribution data of RF coil transmission field of each channel of the RF transmitter coil and the distribution data of RF electric field of each channel of the RF transmitter coil is a trained RF electric field prediction model;

wherein acquiring the trained RF electric field prediction model comprises:

constructing a human-model data set;

obtaining second distribution data of RF coil transmission field of each channel and second distribution data of RF electric field of each channel for each human model through simulation, based on the constructed human-model data set and a channel parameter of the RF transmitter coil, to obtain a training data set; and constructing and training an RF electric field prediction model according to the training data set until a preset condition for an end of training is met, and obtaining the trained RF electric field prediction model;

wherein, the obtaining the second distribution data of RF coil transmission field of each channel and the second distribution data of RF electric field of each channel for each human model through simulation, based on the constructed human-model data set and the channel parameter of the RF transmitter coil, to obtain the training data set, comprises:

determining the number of scan segments and a scan part corresponding to each of the scan segments of each human model according to dimensions of the RF transmitter coil;

performing segmented scans on each human model according to the channel parameter of the RF transmitter coil, the number of the scan segments of each human model, and the scan part corresponding to each of the scan segments, and obtaining third distribution data of RF coil transmission field and third distribution data of RF electric field of the scan part corresponding to each scan segment of each human model; and obtaining the second distribution data of RF coil transmission field of each channel and the second distribution data of RF electric field of each channel for all tissues of each human model, based on the third distribution data of RF coil transmission field and the third distribution data of RF electric field of the scan part corresponding to each of the scan segments of each human model.

* * * * *